United States Patent
Kim et al.

(10) Patent No.: US 10,418,333 B1
(45) Date of Patent: Sep. 17, 2019

(54) WAVEGUIDE ALONG SHIELDED SIDE WALL

(71) Applicant: QUALCOMM Incorporated, San Diego, CA (US)

(72) Inventors: Daeik Kim, Del Mar, CA (US); Jie Fu, Sunnyvale, CA (US); Manuel Aldrete, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/985,978

(22) Filed: May 22, 2018

(51) Int. Cl.
   *H01L 29/82* (2006.01)
   *H01L 21/00* (2006.01)
   *H01L 23/552* (2006.01)
   *H01L 23/66* (2006.01)

(52) U.S. Cl.
   CPC ............ *H01L 23/552* (2013.01); *H01L 23/66* (2013.01); *H01L 2223/6616* (2013.01); *H01L 2223/6627* (2013.01)

(58) Field of Classification Search
   CPC .................................................... H01L 23/552
   USPC .......... 438/3, 59–63; 257/421–426; 174/254, 174/255
   See application file for complete search history.

(56) References Cited

U.S. PATENT DOCUMENTS

| | | | | |
|---|---|---|---|---|
| 6,252,176 | B1 * | 6/2001 | Kuramochi | H05K 1/024 174/254 |
| 7,985,927 | B2 * | 7/2011 | Becker | H05K 1/0219 174/255 |
| 8,759,914 | B1 * | 6/2014 | Rawat | H01L 23/5225 257/208 |

* cited by examiner

*Primary Examiner* — Calvin Lee
(74) *Attorney, Agent, or Firm* — Patterson & Sheridan, L.L.P.

(57) ABSTRACT

Certain aspects of the present disclosure are directed to an integrated circuit (IC) package. The IC package generally includes an IC and a shielding sidewall disposed adjacent to the IC. In certain aspects, the IC comprises a first layer coupled to the shielding sidewall, a second layer comprising a first signal path, and a third layer disposed below the first layer and coupled to the shielding sidewall, wherein the second layer is disposed between the first layer and the third layer. In some cases, the IC also includes a plurality of vias configured to couple the first layer to the third layer, wherein at least a portion of the first signal path is disposed in an inner shielding region that spans from the first layer to the third layer and spans from the shielding sidewall to the plurality of vias.

15 Claims, 8 Drawing Sheets

WAVEGUIDE ALONG SHIELDED SIDE WALL

TECHNICAL FIELD

Certain aspects of the present disclosure generally relate to waveguides and, more particularly, to electromagnetic shielding for the waveguides.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry, which may be include one or more signal paths for communicating an RF signal. In some cases, the RF front-end circuitry may also include electromagnetic shielding for the signal paths for reducing interference and/or noise coupling to other circuit components and transmission lines.

SUMMARY

Certain aspects of the present disclosure are directed to an integrated circuit (IC) package. The IC package generally includes an IC and a shielding sidewall disposed adjacent to the IC. The IC generally includes a first layer coupled to the shielding sidewall, a second layer comprising a first signal path, a third layer disposed below the first layer and coupled to the shielding sidewall, wherein the second layer is disposed between the first layer and the third layer, and a plurality of vias configured to couple the first layer to the third layer, wherein at least a portion of the first signal path is disposed in an inner shielding region that spans from the first layer to the third layer and spans from the shielding sidewall to the plurality of vias.

Certain aspects of the present disclosure are directed to an apparatus for wireless communication. The apparatus generally includes an integrated circuit (IC) package comprising a shielding sidewall, an IC, the shielding sidewall being disposed adjacent to the IC, wherein the IC comprises a first layer coupled to the shielding sidewall, a second layer comprising a first signal path, a third layer disposed below the first layer and coupled to the shielding sidewall, wherein the second layer is disposed between the first layer and the third layer, and a plurality of vias configured to couple the first layer to the third layer, wherein at least a portion of the first signal path is disposed in a shielding region that spans from the first layer to the third layer and spans from the shielding sidewall to the plurality of vias. The apparatus may also include a package substrate having an electric ground layer coupled to the shielding sidewall.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
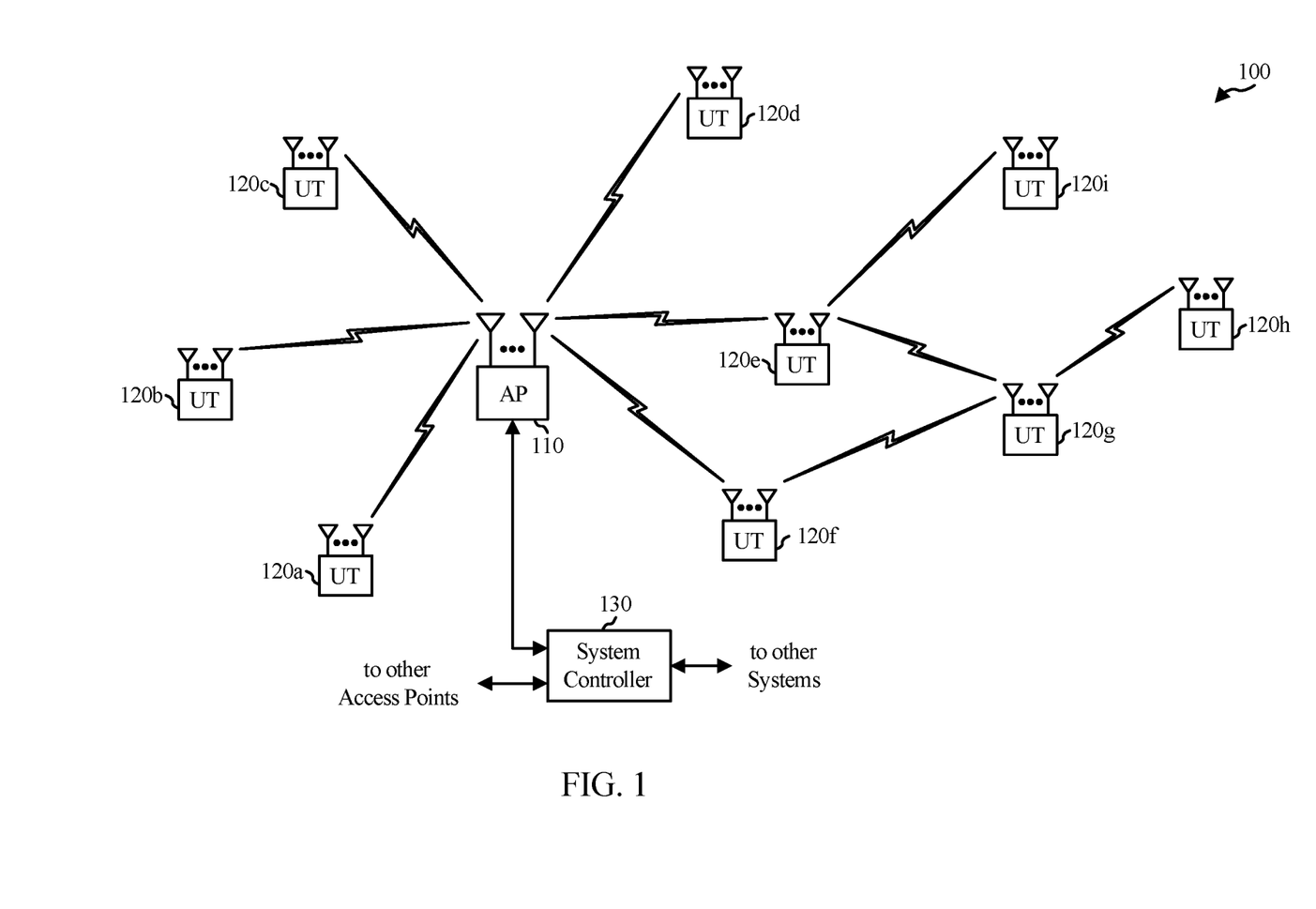
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system, a frequency division duplex (FDD) system, or a code division duplex (CDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include one or more signal paths for communicating RF signals, and may include one or more ground cages for providing electromagnetic shielding for the signal paths, as described in more detail herein.

Figure 2:
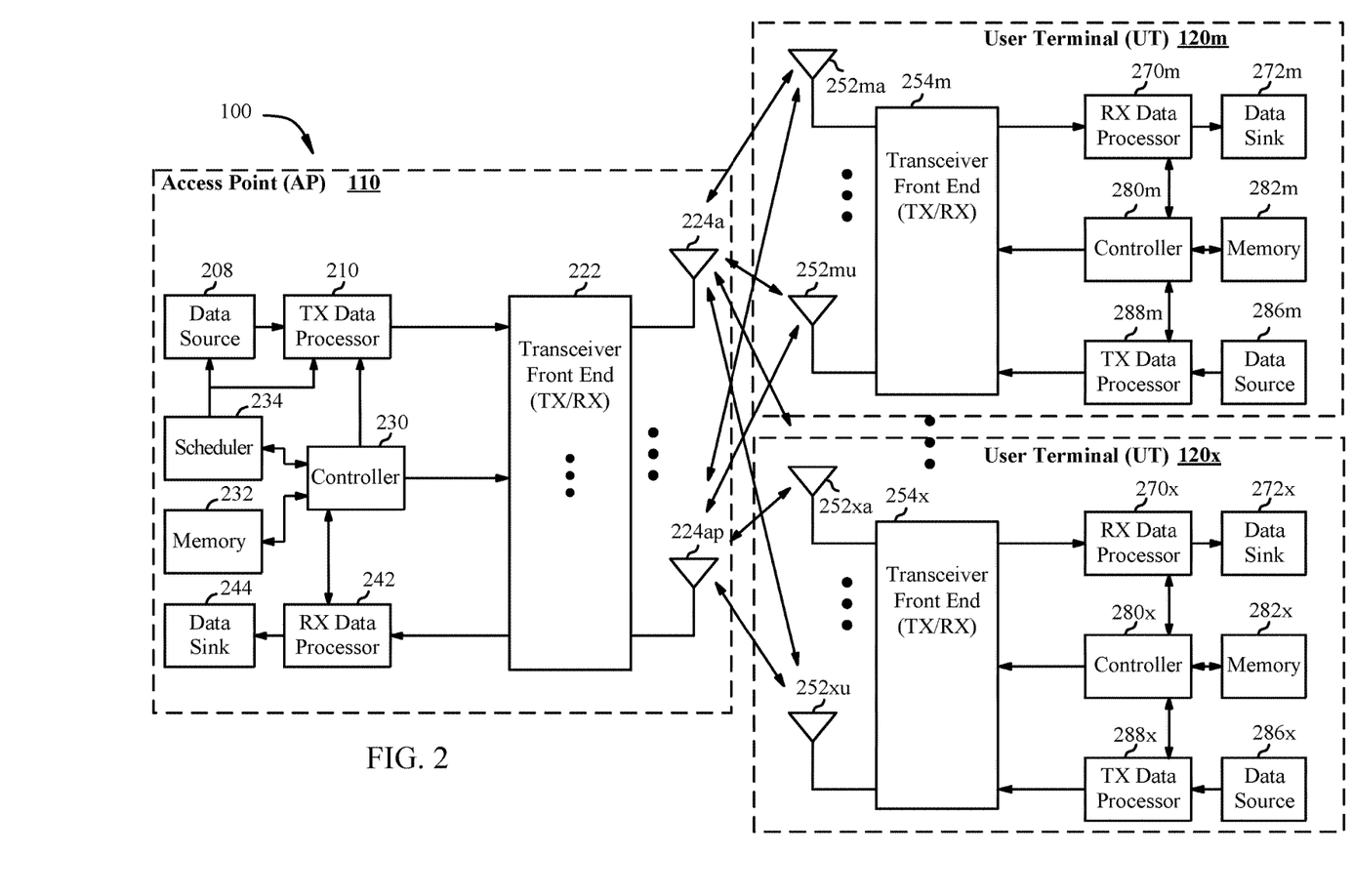
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a circuit having transformers for increasing a voltage of a signal for processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In certain aspects of the present disclosure, the transceiver front end 222 and/or 254 may include one or more signal paths for communicating RF signals, and may include one or more ground cages for providing electromagnetic shielding for the signal paths, as described in more detail herein.

Figure 3:
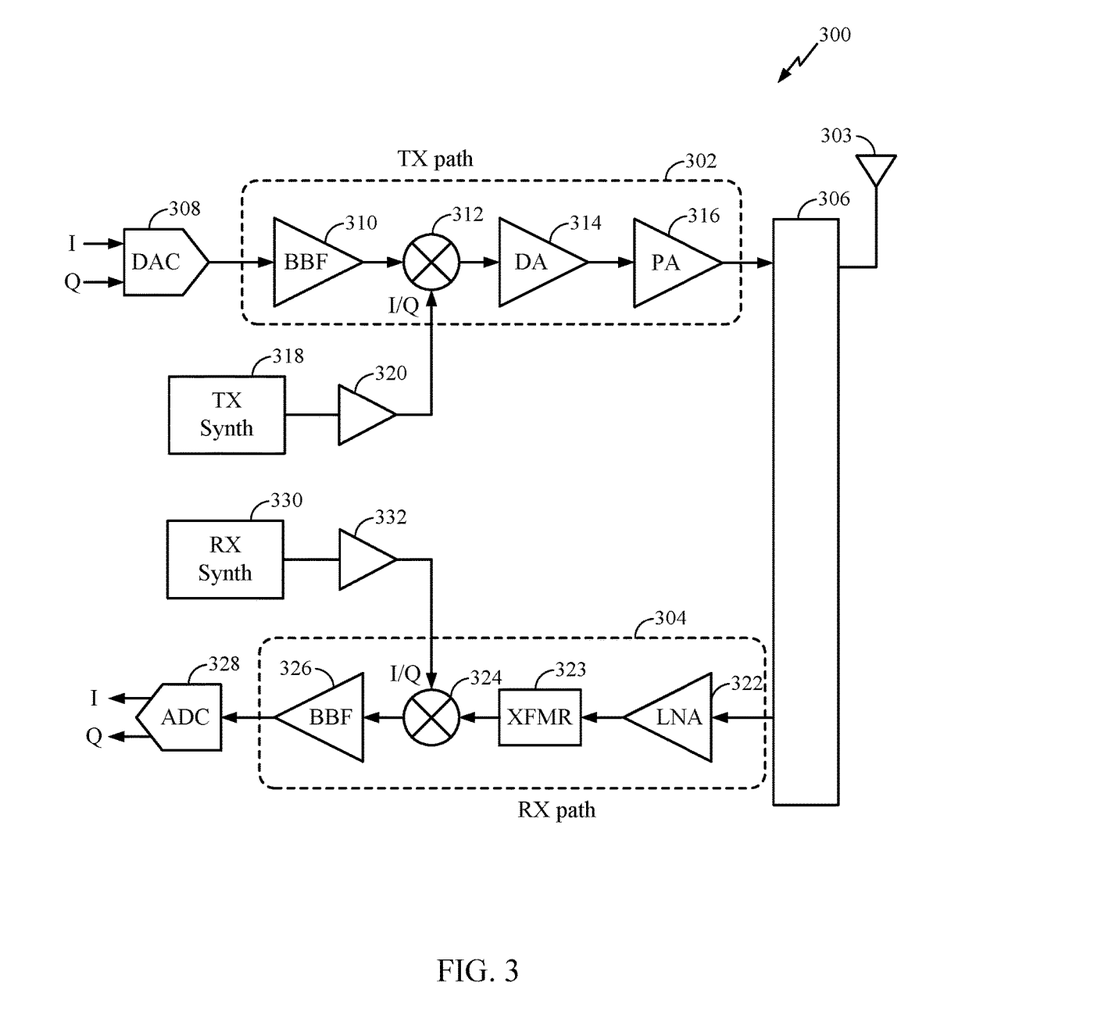
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a transformer circuit 323, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322. The voltage of the amplified signal generated by the LNA may be increased via the transformer circuit 323. The mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects of the present disclosure, the TX path 302 and/or RX path 304 may include one or more signal paths for communicating RF signals, and may include one or more ground cages for providing electromagnetic shielding for the signal paths, as described in more detail herein.

FIGS. 1-3 provide a wireless communication system as an example application in which certain aspects of the present disclosure may be implemented to facilitate understanding. However, electromagnetic shielding for waveguides as provided by certain aspects described herein can be applied in any of various other suitable systems, as well.

Figure 4:
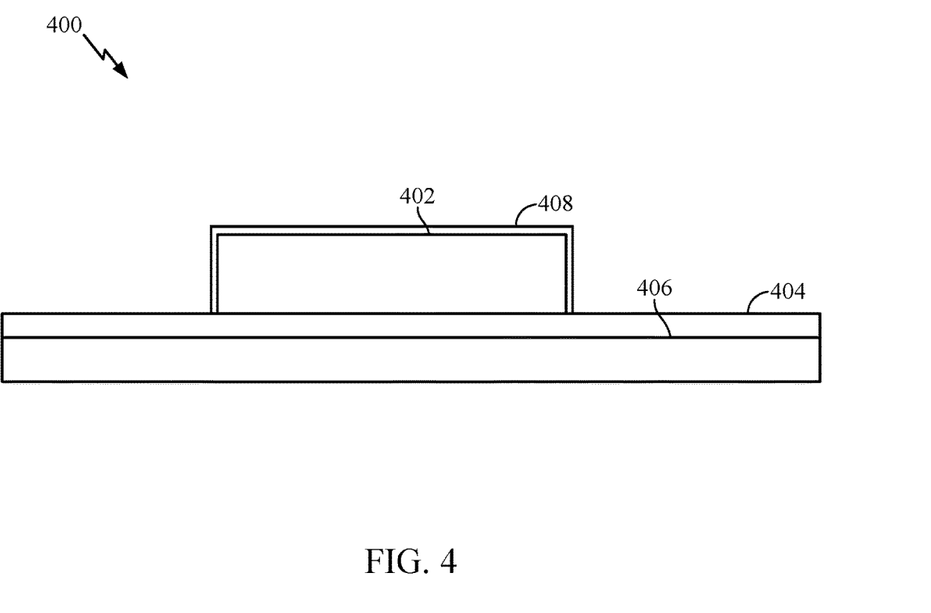
FIG. 4 illustrates an example integrated circuit (IC) package, in accordance with certain aspects of the present disclosure.

FIG. 4 illustrates an integrated circuit (IC) package 400 having IC 402 disposed on a package substrate 404, in accordance with certain aspects of the present disclosure. One or more components of the transceiver front end 300 may be implemented in the IC package 400, which may include one or more signal paths for communicated RF signals, as described herein. The package substrate 404 may include a ground layer 406 which may serve as a reference potential for electrical components of the transceiver front end 300. In certain aspects, the IC package 400 may include a shielding sidewall 408, which may be coupled to the ground layer 406 of the package substrate 404. The shielding sidewall 408 conforms to the shape of the IC 402 (e.g., conforms to the shape of one or more lateral surfaces of the IC) and provides electromagnetic shielding for the IC 402. In certain aspects of the present disclosure, the shielding sidewall 408 may be used to form a ground cage to provide electromagnetic shielding for the one or more RF signal paths, as described in more detail herein.

Although only one IC 402 is illustrated in FIG. 4, it is to be understood that the IC package 400 may include more than one IC. In this case, the multiple ICs may be arranged laterally above the package substrate 400 and/or vertically stacked. The shielding sidewall 408 may surround the multiple ICs and, in some cases, may conform to the shape of the lateral surfaces of the ICs.

Example Waveguide Along Shielded Side Wall

Radio-frequency front end (RFFE) modules use well-defined RF waveguides for signal paths. However, area constraints, embedded components, and laminate substrate design rules may constrain available RF waveguide implementations. Digital signal paths benefit from isolation to protect RF signals. Certain aspects of the present disclosure provide an RF waveguide with strong isolation, and allow for high-speed digital signal paths for, e.g., RFFE mobile industry processor interface (MIPI) control and internal integrated circuit (IC)-to-IC digital communication.

Figure 5:
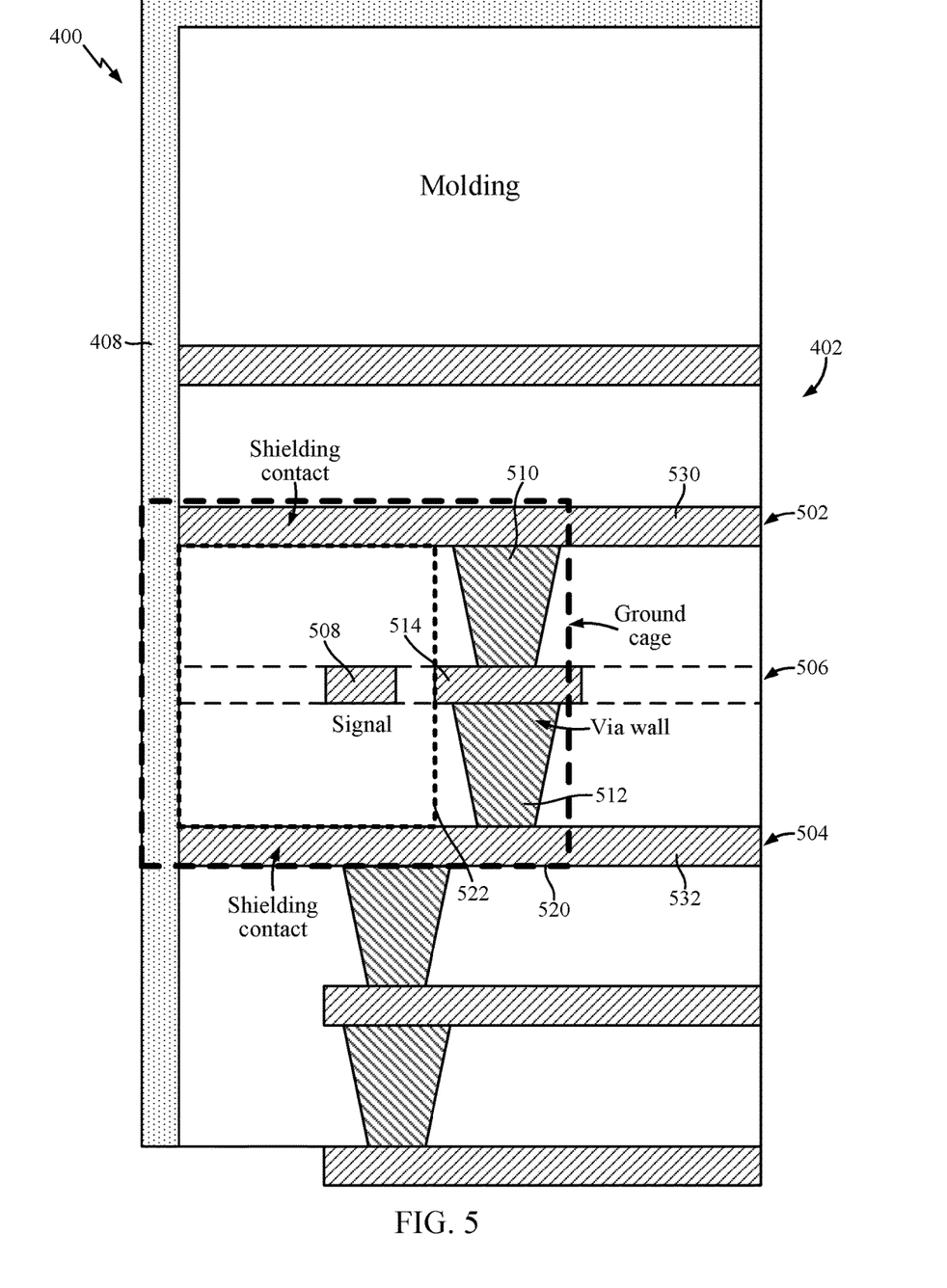
FIG. 5 is a cross-sectional view of an example IC package having a ground cage, in accordance with certain aspects of the present disclosure.

FIG. 5 is a cross-sectional view of the IC package 400, in accordance with certain aspects of the present disclosure. For certain aspects, the IC package 400 may be (or may be part of) an RFFE module, which may include one or more ICs, such as silicon (Si) complementary metal-oxide-semiconductor (CMOS) ICs. The CMOS ICs may use high-speed digital signal paths as described above. As illustrated in FIG. 5, the IC package 400 comprises the IC 402, which includes multiple layers including contact layers 502 and 504. The contact layers 502 and 504 include conductive regions 530 and 532, respectively, coupled to the shielding sidewall 408.

In certain aspects, a signal layer 506 may be disposed between the contact layers 502 and 504 and includes a signal path 508. The IC 402 also includes multiple vias 510 and 512 for connecting the conductive regions 530 and 532 together. Although not shown in this cross-sectional view, there may be additional vias both behind and in front of the vias 510 and 512 shown, creating a via wall (extending behind the printed page and coming out of the page). For example, the via 510 connects the conductive region 530 to a conductive region 514 on the signal layer 506, and the via 512 connects the conductive regions 514 to the conductive region 532. A via is a type of connection between layers of a substrate or IC, which may also be referred to as a vertical interconnect access. While the via 510 is illustrated as being directly on top of via 512, the via 510 may be offset from the via 512 such that the via 510 is not directly on top of via 512.

The via wall formed by vias 510 and 512, the conductive regions 530 and 532, and the shielding sidewall 408 are coupled to the ground layer 406 of the package substrate 404. Thus, the vias 510 and 512, the contact layers 502 and 504, and the shielding sidewall 408 create a ground cage 520 (e.g., an outer shielding region), and form an inner shielding region 522 that provides electromagnetic shielding for the signal path 508 disposed therein, as illustrated. The signal path 508 and the ground cage 520 form an electromagnetic waveguide, similar to a coaxial cable.

Figure 6:
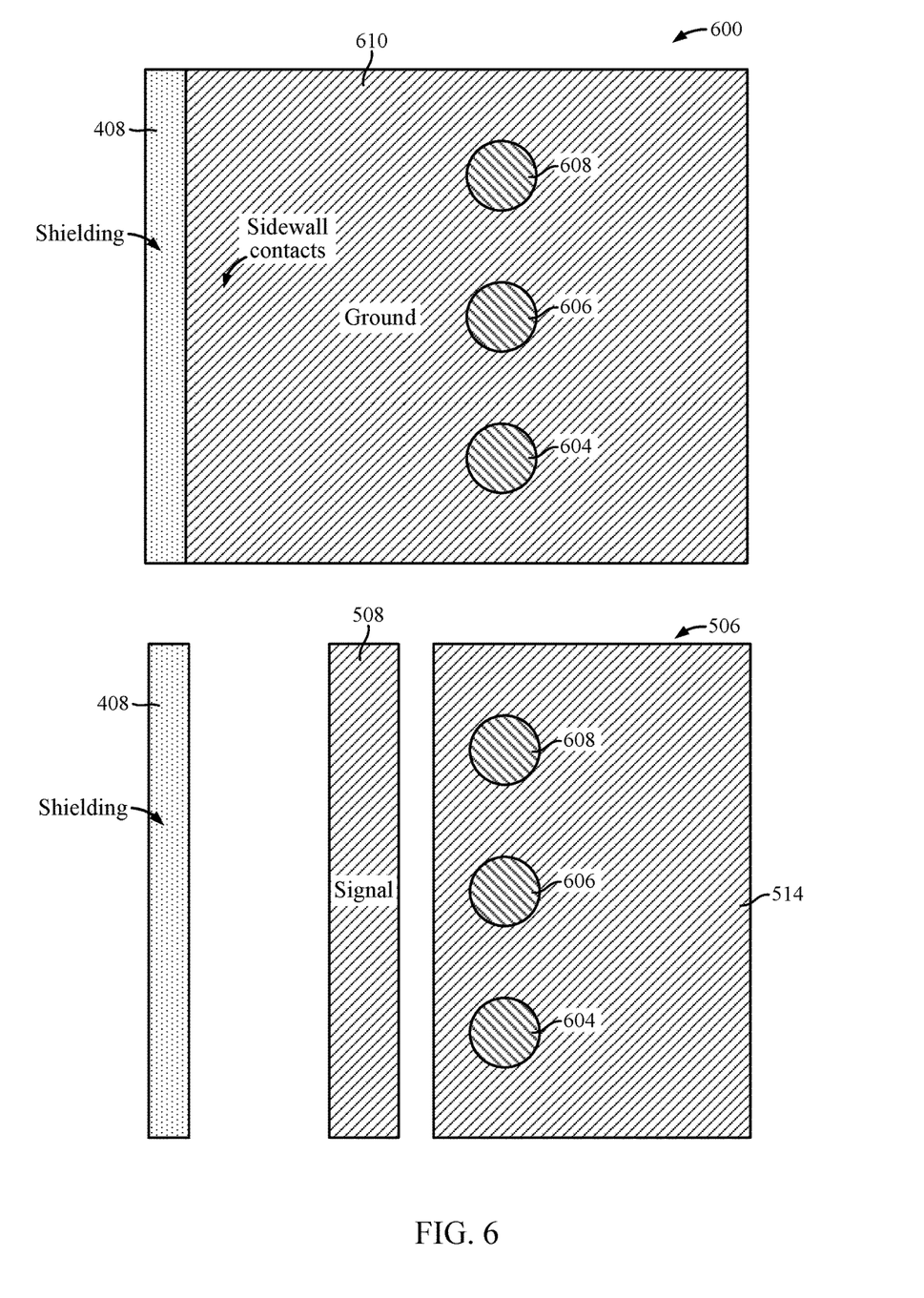
FIG. 6 is a top-down view of an example contact layer and an example signal layer of an IC, in accordance with certain aspects of the present disclosure.

FIG. 6 is a top-down view of an example contact layer 600 and the example signal layer 506, in accordance with certain aspects of the present disclosure. The contact layer 600 may correspond to the contact layer 502 or the contact layer 504 of FIG. 5. As illustrated, multiple vias 604, 606, and 608 are used to couple the conductive regions 514 of the signal layer 506 to a conductive regions 610 of the contact layer 600. For example, the via 604 may correspond to the via 510 or 512 as described with respect to FIG. 5. As illustrated, the conductive region 610 (e.g., corresponding to the conductive region 530 or 532) is coupled to the shielding sidewall 408 such that the conductive region 610 and vias 604, 606, and 608 are coupled to electric ground to form a ground cage.

Figure 7:
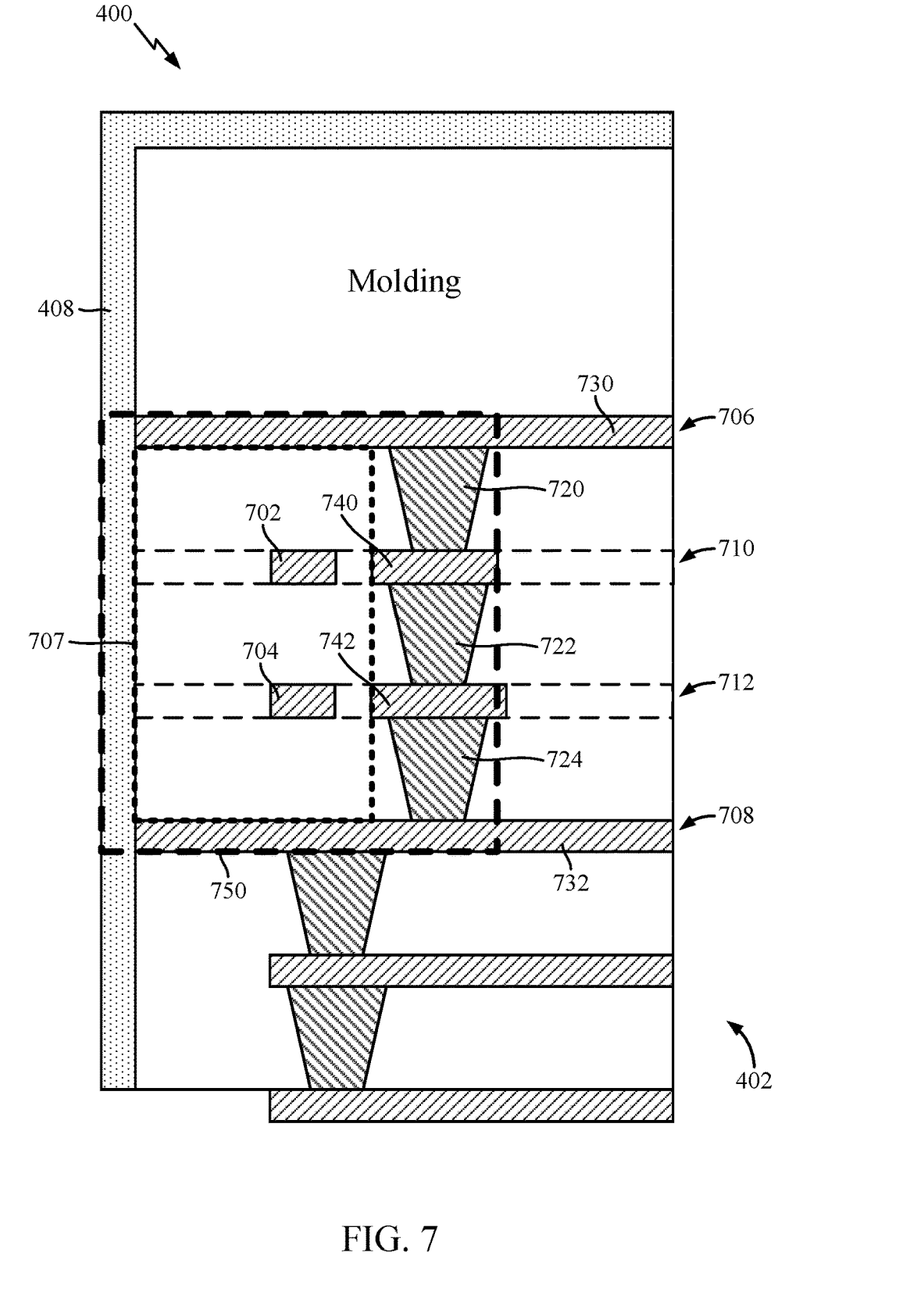
FIG. 7 is a cross-sectional view of an example IC package having two signal paths disposed in a shielding region, in accordance with certain aspects of the present disclosure.

FIG. 7 illustrates an example IC package 400 comprising an IC 402 having two signal paths 702 and 704 disposed in an inner shielding region 707, in accordance with certain aspects of the present disclosure. As illustrated, the IC 402 includes contact layers 706 and 708, and signal layers 710 and 712 having respective signal paths 702 and 704. The signal layers 710 and 712 are disposed between the contact layers 706 and 708.

The contact layers 706 and 708 include conductive regions 730 and 732, respectively, coupled to the shielding sidewall 408. The IC 402 may also include multiple vias for connecting the contact layers 706 and 708. For example, a via 720 connects the conductive region 730 on contact layer 706 to a conductive region 740 on the signal layer 710, the via 722 connects the conductive region 740 to a conductive region 742 on the signal layer 712, and the via 724 connects the conductive region 742 to the conductive region 732 on the contact layer 708.

As described with respect to FIG. 4, the shielding sidewall 408 is coupled to the ground layer 406 of the package substrate 404. Thus, the vias 720, 722, and 724, the conductive regions 730 and 732, and the shielding sidewall 408 create a ground cage 750, and form the inner shielding region 707 that provides electromagnetic shielding for the signal paths 702 and 704 disposed therein, as illustrated.

Figure 8:
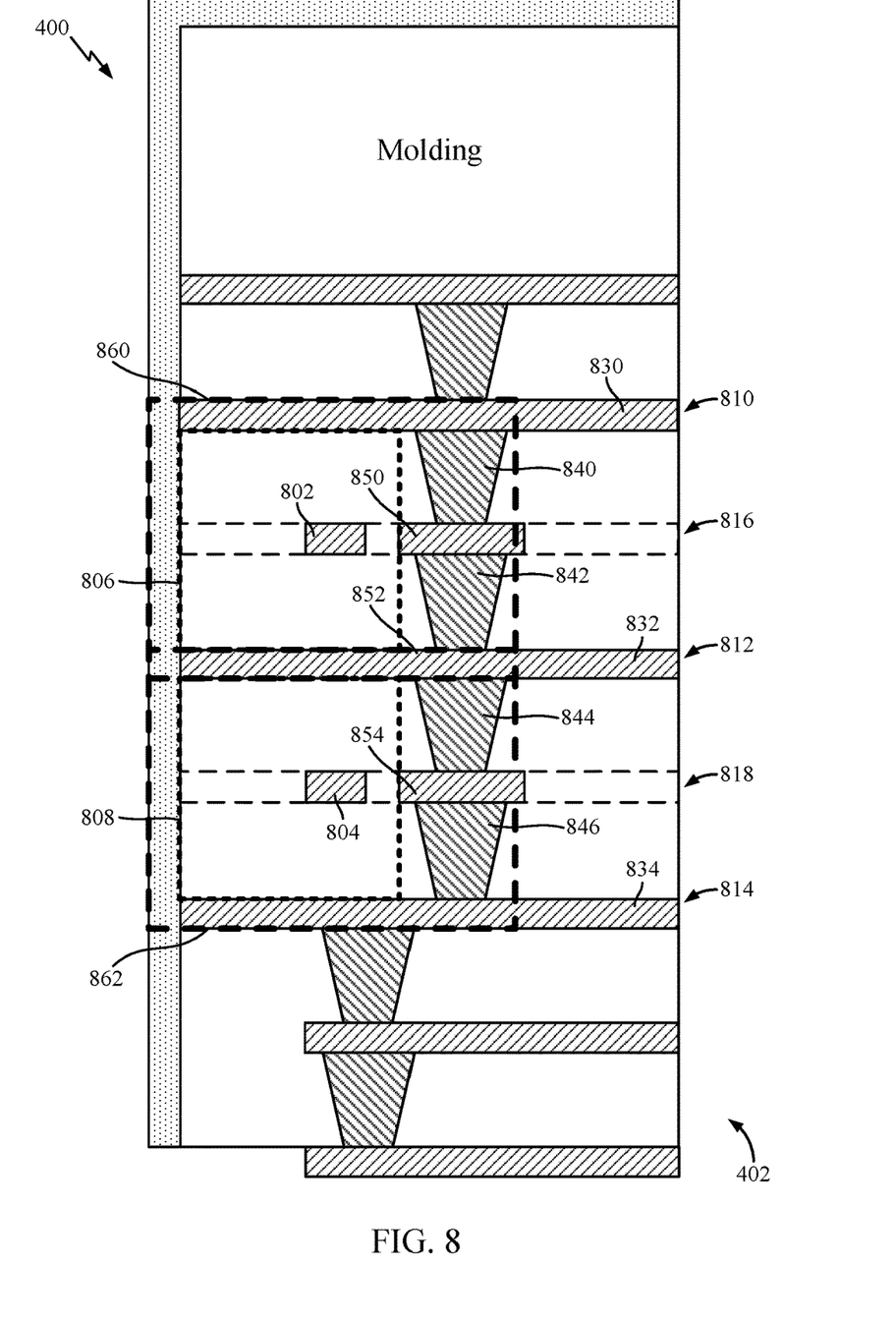
FIG. 8 is a cross-sectional view of an example IC package having two signal paths disposed in separate shielding regions, in accordance with certain aspects of the present disclosure.

FIG. 8 illustrates an example IC package 400 comprising an IC 402 having two signal paths 802 and 804 disposed in separate inner shielding regions 806 and 808, in accordance with certain aspects of the present disclosure. As illustrated, the IC 402 includes contact layers 810, 812, and 814, and signal layers 816 and 818 having respective signal paths 802 and 804. The signal layer 816 is disposed between the contact layers 810 and 812, and the signal layer 818 is disposed between the contact layers 812 and 814.

The contact layers 810, 812, and 814 include conductive regions 830 and 832, and 834, respectively, coupled to the shielding sidewall 408. The IC 402 may also include multiple vias for connecting the conductive regions 830, 832, and 834. For example, the via 840 connects the conductive region 830 on contact layer 810 to a conductive region 850 on the signal layer 816, the via 842 connects the conductive region 850 to a conductive region 852 on the contact layer 812, the via 844 connects the conductive region 852 to a conductive region 854 on the signal layer 818, and the via 846 connects the conductive region 854 to the conductive region 834 on the contact layer 814.

As described with respect to FIG. 4, the shielding sidewall 408 is coupled to the ground layer 406 of the package substrate 404. Thus, the vias 840 and 842, the conductive regions 830 and 852, and the shielding sidewall 408 create a ground cage 860, and form the inner shielding region 806 that provides electromagnetic shielding for the signal path 802 disposed therein. Moreover, the vias 844 and 846, the conductive regions 832 and 834, and the shielding sidewall 408 create a ground cage 862, and form the inner shielding region 808 that provides electromagnetic shielding for the signal path 804 disposed therein.

The aspects described herein provide a structure for creating an inner shielding region for waveguides (e.g., signal paths) which provide several advantages over prior implementations. For example, certain aspects described herein use a shielding sidewall of an IC package to form a ground cage. The thickness of the sidewall provides more effective electromagnetic shielding as compared to, for example, using two separate via walls to create a ground cage. Moreover, using the shielding sidewall to form the ground cage reduces area consumption as compared to using two separate via walls.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An integrated circuit (IC) package comprising:
   an IC; and
   a shielding sidewall disposed adjacent to the IC, wherein the IC comprises:
     a first layer coupled to the shielding sidewall;
     a second layer comprising a first signal path;
     a third layer disposed below the first layer and coupled to the shielding sidewall, wherein the second layer is disposed between the first layer and the third layer; and
     a plurality of vias configured to couple the first layer to the third layer, wherein at least a portion of the first signal path is disposed in an inner shielding region that spans from the first layer to the third layer and spans from the shielding sidewall to the plurality of vias.

2. The IC package of claim 1, wherein the IC further comprises:
   a fourth layer comprising a second signal path;
   a fifth layer disposed below the third layer and coupled to the shielding sidewall, wherein the fourth layer is disposed between the third layer and the fifth layer; and
   another plurality of vias configured to couple the third layer to the fifth layer, at least a portion of the second signal path being disposed in another inner shielding region that spans from the third layer to the fifth layer and spans from the shielding sidewall to the other plurality of vias.

3. The IC package of claim 1, wherein the first signal path comprises a radio-frequency (RF) signal path.

4. The IC package of claim 1, wherein the IC further comprises:
   a fourth layer disposed between the first layer and the second layer and comprising a second signal path, at least a portion of the second signal path being disposed in the inner shielding region.

5. The IC package of claim 4, wherein the plurality of vias comprises:
   a first set of vias coupled between the first layer and the fourth layer;
   a second set of vias coupled between the fourth layer and the second layer; and
   a third set of vias coupled between the second layer and the third layer.

6. The IC package of claim 1, wherein the plurality of vias comprises a first set of vias coupled between the first layer and the second layer, and a second set of vias coupled between the second layer and the third layer.

7. The IC package of claim 6, wherein the first set of vias is disposed directly above the second set of vias.

8. An apparatus for wireless communication, comprising:
   an integrated circuit (IC) package comprising:
     an IC;
     a shielding sidewall disposed adjacent to the IC, wherein the IC comprises:
       a first layer coupled to the shielding sidewall;
       a second layer comprising a first signal path;
       a third layer disposed below the first layer and coupled to the shielding sidewall, wherein the second layer is disposed between the first layer and the third layer; and
       a plurality of vias configured to couple the first layer to the third layer, wherein at least a portion of the first signal path is disposed in an inner shielding region that spans from the first layer to the third layer and spans from the shielding sidewall to the plurality of vias; and
     a package substrate having an electric ground layer coupled to the shielding sidewall.

9. The apparatus of claim 8, wherein the IC further comprises:
   a fourth layer comprising a second signal path;
   a fifth layer disposed below the third layer and coupled to the shielding sidewall, wherein the fourth layer is disposed between the third layer and the fifth layer; and
   another plurality of vias configured to couple the third layer to the fifth layer, at least a portion of the second signal path being disposed in another inner shielding region that spans from the third layer to the fifth layer and spans from the shielding sidewall to the other plurality of vias.

10. The apparatus of claim 8, wherein the first signal path comprises a radio-frequency (RF) signal path.

11. The apparatus of claim 8, wherein the shielding sidewall conforms to a shape of a lateral surface of the IC.

12. The apparatus of claim 8, wherein the IC further comprises:
   a fourth layer disposed between the first layer and the second layer and comprising a second signal path, at least a portion of the second signal path being disposed in the inner shielding region.

13. The apparatus of claim 12, wherein the plurality of vias comprises:
   a first set of vias coupled between the first layer and the fourth layer;
   a second set of vias coupled between the fourth layer and the second layer; and a third set of vias coupled between the second layer and the third layer.

14. The apparatus of claim 8, wherein the plurality of vias comprises a first set of vias coupled between the first layer and the second layer, and a second set of vias coupled between the second layer and the third layer.

15. The apparatus of claim 14, wherein the first set of vias is offset from the second set of vias.

* * * * *